(12) United States Patent
Pal et al.

(10) Patent No.: US 10,991,552 B2
(45) Date of Patent: Apr. 27, 2021

(54) COOLING MECHANISM UTILIZED IN A PLASMA REACTOR WITH ENHANCED TEMPERATURE REGULATION

(71) Applicant: Applied Materials, Inc., Santa Clara, CA (US)

(72) Inventors: Aniruddha Pal, San Jose, CA (US); Victor Calderon, Sunnyvale, CA (US); Martin Jeffrey Salinas, San Jose, CA (US); Valentin N. Todorow, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 174 days.

(21) Appl. No.: 16/286,152

(22) Filed: Feb. 26, 2019

(65) Prior Publication Data
US 2019/0198295 A1    Jun. 27, 2019

Related U.S. Application Data

(62) Division of application No. 14/242,473, filed on Apr. 1, 2014, now Pat. No. 10,249,475.

(51) Int. Cl.
*C23C 16/00* (2006.01)
*H01L 21/67* (2006.01)
*H01J 37/32* (2006.01)

(52) U.S. Cl.
CPC ......... *H01J 37/3211* (2013.01); *H01J 37/321* (2013.01); *H01J 37/32449* (2013.01); *H01J 37/32522* (2013.01); *H01J 37/32633* (2013.01)

(58) Field of Classification Search
CPC .............. H01J 37/321; H01J 37/3211; H01J 37/32119; H01J 37/32128; H01J 37/32137; H01J 37/32146; H01J 37/32155; H01J 37/32165; H01J 37/32174; H01J 37/32183; H01J 37/32522; H01J 37/32633; H01J 37/32449; H05H 2001/4652; H05H 2001/466; H05H 2001/4667; C23C 16/45587; C23C 16/45589; C23C 16/45591

See application file for complete search history.

(56) References Cited

U.S. PATENT DOCUMENTS

| 5,266,364 | A | | 11/1993 | Tamura et al. | |
|---|---|---|---|---|---|
| 5,525,159 | A | * | 6/1996 | Hama | C23C 16/4404 118/723 I |
| 5,944,899 | A | * | 8/1999 | Guo | H01J 37/321 118/715 |
| 6,189,484 | B1 | * | 2/2001 | Yin | H01J 37/321 118/723 I |

(Continued)

*Primary Examiner* — Luz L Alejandro Mulero
(74) *Attorney, Agent, or Firm* — Patterson + Sheridan, LLP

(57) ABSTRACT

Embodiments of the invention generally provide a cooling mechanism utilized in a plasma reactor that may provide efficient temperature control during a plasma process. In one embodiment, a cooling mechanism disposed in a plasma processing apparatus includes a coil antenna enclosure formed in a processing chamber, a coil antenna assembly disposed in the coil antenna enclosure, a plurality of air circulating elements disposed in the coil antenna enclosure adjacent to the coil antenna assembly, and a baffle plate disposed in the coil antenna enclosure below and adjacent to the coil antenna assembly.

20 Claims, 3 Drawing Sheets

(56) References Cited

U.S. PATENT DOCUMENTS

| | | | |
|---|---|---|---|
| 6,367,410 B1 * | 4/2002 | Leahey | H01L 21/67103 |
| | | | 118/723 I |
| 6,983,892 B2 | 1/2006 | Noorbakhsh et al. | |
| 9,029,267 B2 | 5/2015 | Sant et al. | |
| 2002/0088548 A1 * | 7/2002 | Kim | H01J 37/32522 |
| | | | 156/345.48 |
| 2004/0065645 A1 * | 4/2004 | Welch | H01L 21/67109 |
| | | | 219/121.43 |
| 2004/0191545 A1 | 9/2004 | Han et al. | |
| 2005/0020070 A1 | 1/2005 | Ichiki et al. | |
| 2005/0093460 A1 * | 5/2005 | Kim | H01J 37/3211 |
| | | | 315/111.21 |
| 2005/0239291 A1 | 10/2005 | Alba et al. | |
| 2007/0068624 A1 | 3/2007 | Jeon et al. | |
| 2009/0236315 A1 | 9/2009 | Willwerth et al. | |
| 2011/0048644 A1 * | 3/2011 | Collins | H01J 37/3211 |
| | | | 156/345.48 |
| 2011/0097901 A1 | 4/2011 | Banna et al. | |
| 2012/0043023 A1 | 2/2012 | Ramaswamy et al. | |
| 2012/0097870 A1 | 4/2012 | Leray et al. | |
| 2012/0103524 A1 | 5/2012 | Chebi et al. | |
| 2012/0104950 A1 | 5/2012 | Banna et al. | |
| 2012/0211358 A1 | 8/2012 | Miller et al. | |
| 2015/0020969 A1 | 1/2015 | Sriraman et al. | |

* cited by examiner

COOLING MECHANISM UTILIZED IN A PLASMA REACTOR WITH ENHANCED TEMPERATURE REGULATION

CROSS-REFERENCE TO RELATED APPLICATIONS

This application is a divisional application of U.S. patent application Ser. No. 14/242,473, field Apr. 1, 2014 which is incorporated herein by reference in its entirety.

BACKGROUND

Field

Embodiments of the present invention generally relate to semiconductor substrate processing systems. More specifically, the invention relates to a cooling mechanism utilized in a plasma processing system with enhanced temperature regulation.

Background

In manufacture of integrated circuits, precise control of various process parameters is required for achieving consistent results within a substrate, as well as the results that are reproducible from substrate to substrate. As the geometry limits of the structures for forming semiconductor devices are pushed against technology limits, tighter tolerances and precise process control are critical to fabrication success. However, with shrinking geometries, precise critical dimension and etch process control has become increasingly difficult.

Many semiconductor devices are processed in the presence of a plasma. The plasma may be easily ignited in processing chambers that utilized capacitively coupled power to energize the gases forming the plasma. However, plasma ignition in other types of processing chambers may not be as easily initiated, often requiring a spike of power to ignite the gases within the chamber. Unfortunately, such power spikes often results in overly high temperature generation to chamber components, which diminish the service life of the chamber components and undesirably generate particles within the processing chamber which undesirably contributes to defect rates.

Furthermore, unstable source of the plasma source or ignition also result in temperature unstable, thereby resulting in temperature gradient formed in the processing environment. Temperature gradient may undesirably create non-uniform distribution of the plasma across the substrate, thereby resulting in etching rate non-uniform, thereby resulting over-etching or under-etching of the resultant structure formed on the substrate. In a deposition process, non-uniform plasma distribution may also result in film profile distortion or incomplete structure formation.

Therefore, there is a need for an apparatus and methods for improving stable temperature regulation during a plasma process within a processing chamber.

SUMMARY

Embodiments of the invention generally provide a cooling mechanism utilized in a plasma reactor that may provide efficient and stable temperature control during a plasma process. The improved apparatus enhances temperature regulation at locations adjacent to a coil antenna assembly utilized to generate plasma during a plasma process. The improved apparatus may be utilized in etch, deposition, implant, and thermal processing systems, among other applications where plasma generation with reduced sputtering of chamber components is desirable.

In one embodiment, a cooling mechanism disposed in a plasma processing apparatus includes a coil antenna enclosure formed in a processing chamber, a coil antenna assembly disposed in the coil antenna enclosure, a plurality of air circulating elements disposed in the coil antenna enclosure adjacent to the coil antenna assembly, and a baffle plate disposed in the coil antenna enclosure below and adjacent to the coil antenna assembly.

In another embodiment, a plasma processing chamber includes a chamber body, a lid enclosing an interior volume of the chamber body, a substrate support disposed in the interior volume, a coil antenna enclosure disposed on the lid, a coil antenna assembly disposed in the coil antenna enclosure, and a cooling mechanism disposed in the coil antenna enclosure adjacent to the coil antenna assembly.

In yet another embodiment, a method for regulating temperature of a coil antenna assembly disposed in a processing chamber includes rotating a plurality of air circulating means disposed adjacent to a coil antenna assembly in a coil antenna enclosure, directing air in ambient supplied from a perforation formed on a sidewall of the coil antenna enclosure, guiding the air by a baffle plate to a center region of the coil antenna assembly through a central opening formed in the baffle plate, and circulating the air out of the coil antenna enclosure.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
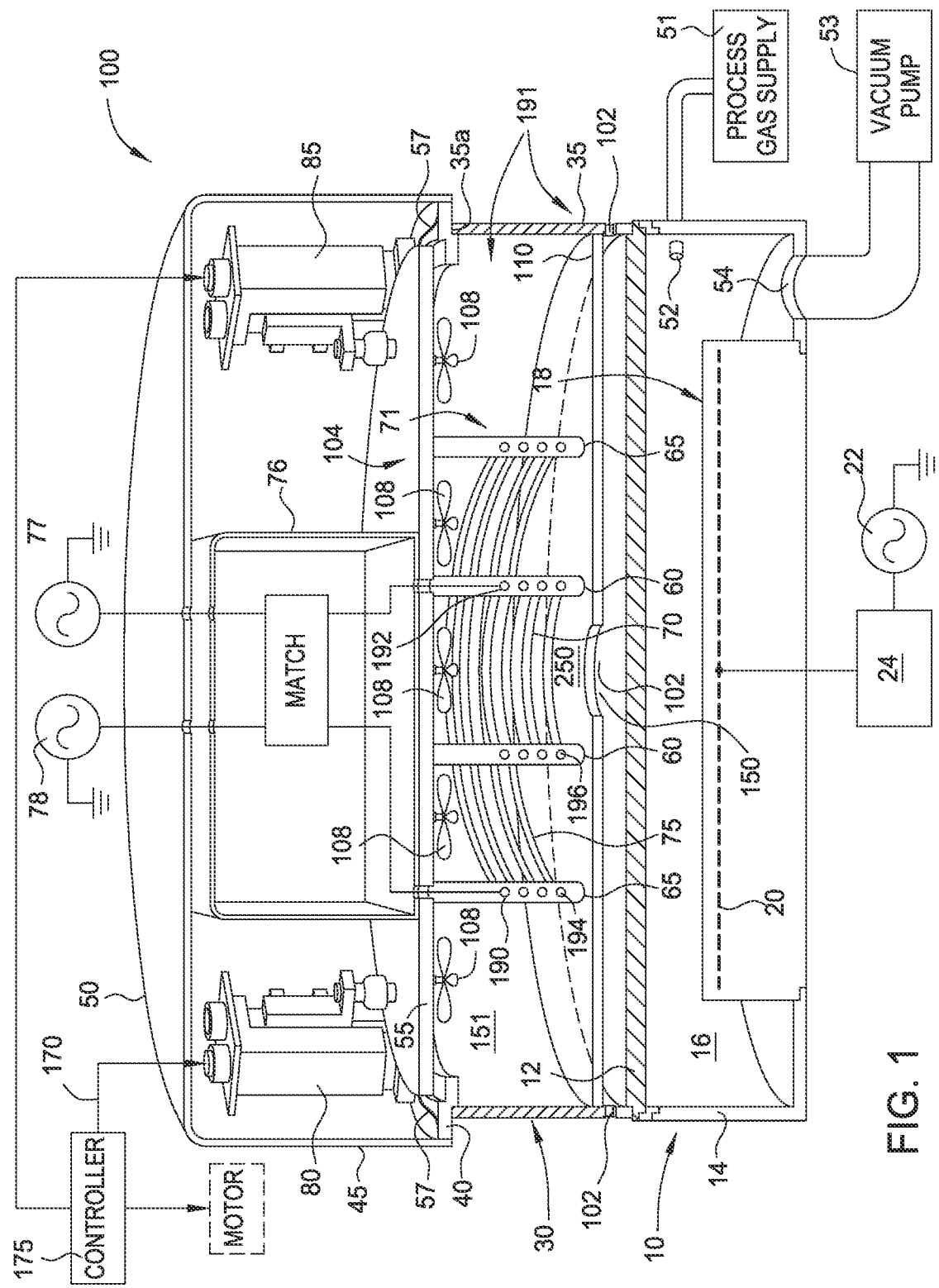
FIG. 1 is a schematic diagram of an exemplary semiconductor substrate processing apparatus comprising a cooling mechanism disposed adjacent to a coil antenna assembly in accordance with one embodiment of the invention.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

Embodiments of the invention generally provide an apparatus with a cooling mechanism to enhance temperature regulation maintained adjacent to a coil antenna assembly in a processing chamber. The cooling mechanism may include at least a baffle plate and a plurality of air circulating elements. The enhanced temperature regulation may be obtained by disposing a baffle plate at a predetermined location in a processing chamber adjacent to a coil antenna assembly so as to efficiently control heat energy release generated from the coil antenna assembly during a plasma process. A plurality of air circulating elements is utilized to circulate heat away from the coil antenna assembly so as to keep the temperature range at a desired level.

FIG. 1 is a schematic diagram of an exemplary semiconductor substrate processing apparatus 100 comprising a cooling mechanism 191 disposed adjacent to a coil antenna assembly 104. In one embodiment, the semiconductor substrate processing apparatus 100 of FIG. 1 may be configured to perform a reactive ion etch process using an RF inductively coupled plasma generated by the coil antenna assembly 104 with good temperature regulation disposed in the semiconductor substrate processing apparatus 100. It is also contemplated that the coil antenna assembly 104 along with the cooling mechanism 191 that may beneficially be utilized in other types of plasma processing chambers, including chemical vapor deposition chambers, physical vapor deposition chambers, implantation chambers, nitriding chambers, plasma annealing chambers, plasma treatment chambers, and ashing chambers, among others. Thus, the embodiment of exemplary semiconductor substrate processing apparatus 100 of FIG. 1 is provided for illustrative purposes and should not be used to limit the scope of the invention.

The semiconductor substrate processing apparatus 100 includes a chamber body 10 including a lid 12 and a cylindrical side wall 14 defining a processing chamber 16. The lid 12 is transmissive to RF power and allows coupling of RF power provided by an inductively coupled plasma source power applicator 71 positioned above the lid 12 to process gases within the processing chamber 16. The lid 12 may be fabricated from any suitable material, and in the embodiment depicted in FIG. 1, the lid 12 is fabricated from a dielectric material, such as quartz.

Inside the processing chamber 16 is a substrate support pedestal 18 including a bias electrode 20. A plasma bias power generator 22 is coupled through an RF bias impedance match 24 to the bias electrode 20. A process gas supply 51 provides process gas into the processing chamber 16 through process gas distribution apparatus 52 which may be provided in the side wall 14 (as shown) or in the lid 12, for example. A vacuum pump 53 evacuates the processing chamber 16 through a pumping port 54.

A coil antenna enclosure 30 formed of metal is provided above the lid 12 and includes a metallic grounded base cylindrical side wall 35 having a top edge 35a supporting a shoulder ring 40, and a conductive top cylindrical side wall 45 extending from the shoulder ring 40 and supporting an overlying conductive cover 50. The conductive cover 50 and the top cylindrical side wall 45 may be integrally formed together and may be coupled to ground. A floating support plate 55 is located on or slightly above the shoulder ring 40, and is supported in a manner to be described below.

The inductively coupled plasma source power applicator 71 is disposed in the semiconductor substrate processing apparatus 100 configured to generate inductively coupled plasma. The inductively coupled plasma source power applicator 71 includes the coil antenna assembly 104. The coil antenna assembly 104 is supported below the support plate 55 by two sets of brackets 60, 65 extending downwardly from the support plate 55. The support plate 55 defines the coil antenna assembly 104 locating in a coil positioning region 151 at a lower port of the coil antenna enclosure 30. The support plate 55 serves as a ceiling of the coil positioning region 151 and the chamber lid 12 serves as the bottom of the coil positioning region 151.

The coil antenna assembly 104 includes at least one coil antenna, and in the embodiment depicted in FIG. 1, the coil antenna assembly 104 includes one or more inner coil antennas 70 and one or more outer coil antennas 75. The outer coil antenna 75 may be concentric with the inner coil antenna 70. The brackets 60 support the inner coil antenna 70 while the brackets 65 support the outer coil antenna 75 above the chamber lid 12. The coil antennas 70, 75 may have a helical configuration. First ends 190, 192 of each coil antennas 75, 70 are coupled through a RF impedance match box 76 to one or more RF power generators 77, 78 while second ends 194, 196 of each coil antennas 75, 70 are coupled to ground. This creates a voltage drop across the coil antennas 75, 70 such that the first ends 190, 192 have a greater voltage potential relative to the second ends 194, 196 of the coil antennas 75, 70.

A cooling mechanism 191 may be disposed adjacent (e.g., above and/or below) the coil antenna assembly 104 to efficiently control temperature in the coil antenna enclosure 30 during a plasma process. In one embodiment, the cooling mechanism 191 includes at least a baffle plate 110 and a plurality of air circulating elements 108. The baffle plate 110 is disposed at a position adjacent to (e.g., below) where the coil antenna assembly 104 is disposed in the coil antenna enclosure 30. The baffle plate 110 may efficiently direct air supplied from a plurality of perforations 102 formed through the side wall 35 of the coil antenna enclosure 30 to a center region 250 defined by the inner coil antenna 70 of coil antenna assembly 104 in the coil positioning region 151. The baffle plate 110 has a central opening 150 that provides access for air to pass therethrough to the center region 250 of the coil antenna assembly 104 to efficiently cool the coil antennas 70, 75. The central opening 150 is sized to be smaller than the inside diameter of the inner coil antenna 70 so that cooling air flowing through the opening 150 is accelerated near the center of the lid 12, thereby more efficiently cooling the center of the lid 12 and contribution to maintain a uniform lid temperature profile that counteracts the tendency of lid 12 to be hotter at its center due to the plasma.

In operation, voltage may be applied to the coil antenna assembly 104 to generate plasma. Heat energy may also be generated accompanying with the voltage generated to the coil antenna assembly 104. As the demand for high RF plasma energy in a plasma process increases, a good heat management is also required so as to provide a stable hardware environment for a plasma process. By utilizing air from an ambient environment at room temperature, cool fresh air may efficiently cool off the heated coil antennas 70, 75 and the lid 12, and circulate the heat energy away from the center portion of the lid 12 and the coil antennas 70, 75. In one embodiment, the baffle plate 110 may efficiently guide the air to the center region 250 of the coil antenna assembly 104 to drive the heat energy out of the coil antenna assembly 104. The baffle plate 110 may be fabricated from a material that may have high heat resistance, or is an electric insulator. In one embodiment, the baffle plate 110 may be fabricated from a plastic material, metallic material, or other suitable dielectric material. In one example, the baffle plate 110 is a plastic material made from Ultem or Teflon®.

The central opening 150 of the baffle plate 110 may be sized to allow air to pass therethrough to the center region 250 defined by the inner coil antenna 70, so as to efficiently provide cool air circulation to the place where most of heat energy is accumulated. In one embodiment, the central opening 150 has a diameter between about 300 mm and about 400 mm with the baffle plate 110 having a diameter between about 500 mm and about 650 mm. In one embodiment, the baffle plate 110 may be disposed between about 100 mm and about 150 mm from the chamber lid 12.

In one embodiment, the perforations 102 formed in the side wall 35 of the coil antenna enclosure 30 may vary in numbers, size, or in any geometric configurations, including circular, square, rectangular, or the like. The perforations 102 may be formed and located in the enclosure 30 about one third in length from a bottom, e.g., the lid 12, of the side wall 35 of the coil antenna enclosure 30. It is noted that the perforations 102 may allow fresh cool air from the ambient to circulate and drive away heat generated during a plasma process. Although the embodiment depicted in FIG. 1 only shows two perforations 102 formed on two sides of the coil antenna enclosure 30, it is noted that number and density of the perforations 102 formed in the coil antenna enclosure 30 may vary as needed.

The plurality of temperature circulating elements 108 may also be disposed adjacent to (e.g., above) the coil antenna assembly 104 in the coil positioning region 151 to assist circulating away heat energy therefrom. The temperature circulating elements 108 may be cooling fans. Although the embodiment depicted in FIG. 1 shows the temperature circulating elements 108 in form of fans, it is noted that the temperature circulating elements 108 may be in any form that may assist air flow or dynamic air movement in the coil positioning region 151, such as stirrers or the like. The location where the temperature circulating elements 108 may be disposed in the coil positioning region 151 may be selected to maximize the air cooling/flow efficiency. In one embodiment, the temperature circulating elements 108 may be located at a position adjacent to the center region 250, such as on the ceiling of the coil positioning region 151 above the center region 250, to assist cooling during the plasma process. In some embodiments, the center region 250 defined in coil antenna assembly 104 appears to have a relatively high thermal energy accumulation (e.g., high temperature) as compared to other locations in the coil positioning region 151. As such, a higher number of the temperature circulating elements 108 may be selected to be disposed adjacent to the center region 250. It is noted that the number and locations of the temperature circulating elements 108 may be disposed as many as needed, including sidewall, ceiling, bottom of the coil positioning region 151, upper portion of the coil antenna enclosure 30 where the RF impedance match box 76 is located, or in the inner and outer coil antenna 70, 75 of the coil antenna assembly 104.

The RF impedance match box 76 rests on the support plate 55. The first RF power generator 77 is coupled to the inner coil antenna 70 through impedance match elements (not shown) in the impedance match box 76. The second RF power generator 78 is coupled to the outer coil antenna 75 through other impedance match elements (not shown) in the impedance match box 76.

During plasma processing, the coil antenna assembly 104 is energized with RF power provided by the power generators 77, 78 to maintain a plasma formed from the process gasses within in the internal volume of the chamber body 10.

A flexible RF gasket 57 provides an RF shield and electrical continuity between the shoulder ring 40 and the floating support plate 55. The RF gasket 57 may be an annular copper mesh, and may be interrupted to accommodate the support servos described below. The support plate 55 is supported by three support servos 80, 85, 90 placed at equal (120 degree) intervals on the shoulder ring 40. The support servos 80, 85, 90 are identical in one embodiment.

A control signal cable 170 furnishes electrical control signals and power from a central controller 175 of the semiconductor substrate processing apparatus 100 of FIG. 1. The central controller 175 controls each of the three support servos 80, 85, 90. Placement of the three support servos 80, 85, 90 at equal intervals around the shoulder ring 40 enables the controller 175 to rotate the floating support plate 55 about any tilt axis oriented along any azimuthal angle 0 relative to an axis of symmetry of the processing chamber 16.

Figure 2:
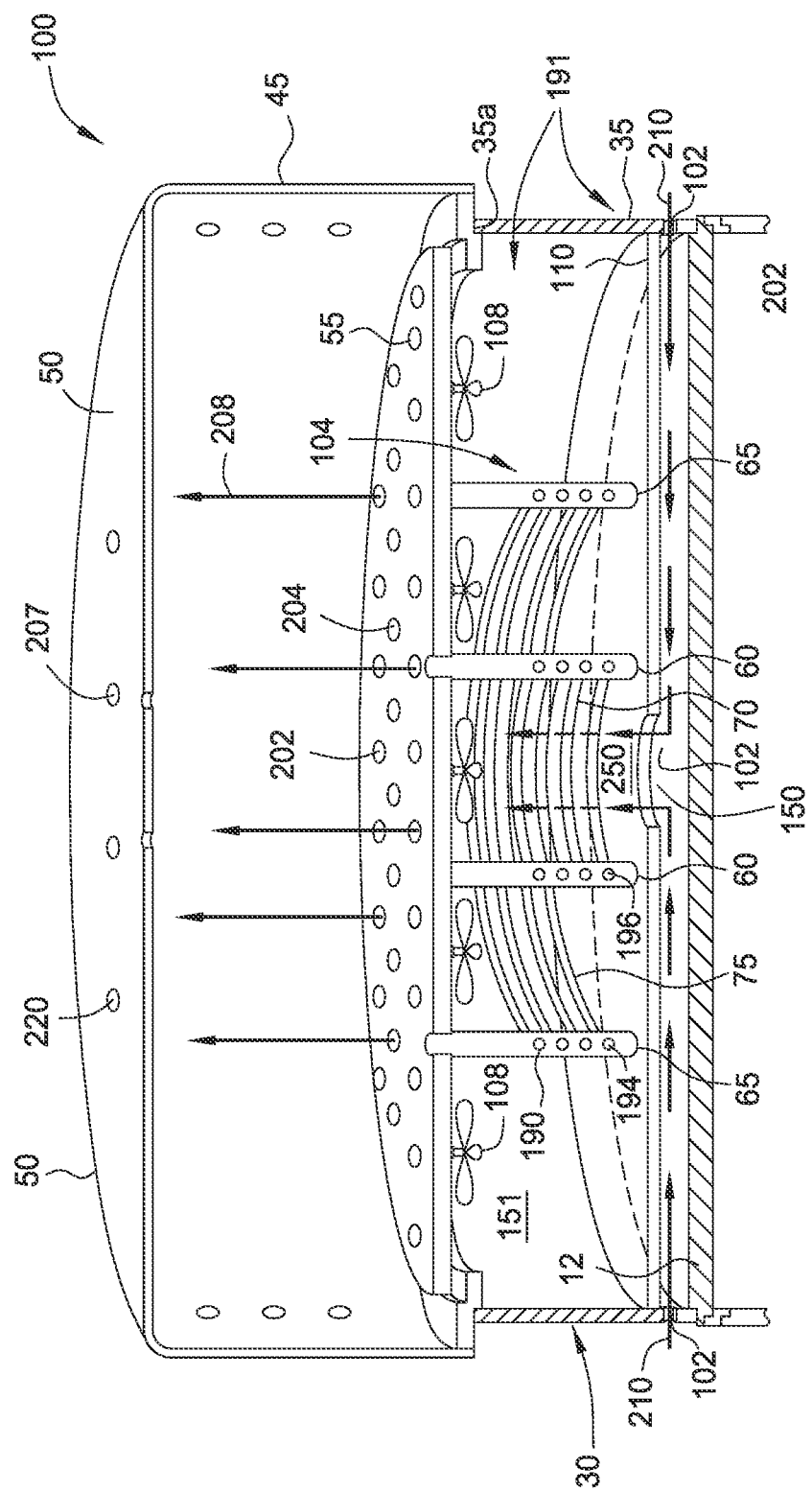
FIG. 2 is a schematic diagram of one embodiment of a cooling mechanism disposed adjacent to the coil antenna assembly of FIG. 1.

FIG. 2 is a schematic view of one embodiment of the coil positioning region 151 located at the lower part of the coil antenna enclosure 30. In operation of a plasma process, voltage power supplied to energize the coil antenna assembly 104 may generate thermal energy. The thermal energy accumulated adjacent to the coil antenna assembly 104 may increase the likelihood of parts damage to the coil antenna assembly 104 or the nearby chamber components, undesirably resulting in mechanical fault. Accordingly, when thermal energy accumulates, the cooling mechanism 191 may be turned on to efficiently cool down temperature and release excess thermal energy from the coil positioning region 151.

In one embodiment, the air circulating elements 108 may be rotated to circulate nearby hot air and/or thermal energy generated during the plasma process. When hot air/thermal energy circulates, dynamic flow will bring fresh air from the ambient to constantly flow through the perforation 102 into the coil positioning region 151, as indicated by the arrow 210. Fresh air from the perforation 102 is then directed by the baffle plate 110 to the center region 250 of the coil antenna assembly 104 through the central opening 150 defined in the baffle plate 110. As the air circulating elements 108 rotates, fresh air flows upward, forcing the thermal energy/heated air to flow out of the coil positioning region 151 through perforations 202, 204 formed on the ceiling, e.g., the support plate 55, out of the coil positioning region 151, as indicated by the arrow 208. The number and size of the perforations 202, 204 formed on the ceiling, e.g., the support plate 55, of the coil positioning region 151 may be varied as needed. As hot air naturally has a lighter weight than that of cool air, the heated air tends to continually flow upward during circulation and eventually be driven out to ambient through another set of perforations 207, 220 formed on the conductive cover 50 of the coil antenna enclosure 30. Similarly, the perforations 207, 220 formed on the conductive cover 50 may be of any size, number, shape or any configuration as needed.

Accordingly, by utilizing the plurality of air circulating elements 108 and the baffle plate 110, fresh air may be constantly guided through to the coil positioning region 151 during a predetermined flow path defined in large part by the baffle plate 110. The constant supply of the fresh air from ambient may drive the thermal energy/hot air generated during the plasma process out of the coil antenna enclosure 30 and back to the ambient, thereby maintaining a desired range of temperature control within the coil antenna enclosure 30. As such, the cooling mechanism 191 as configured in the coil antenna enclosure 30 may efficiently regulate the temperature adjacent to the coil antenna assembly 104, providing a reliable and temperature-consistent environment during a plasma process.

Figure 3:
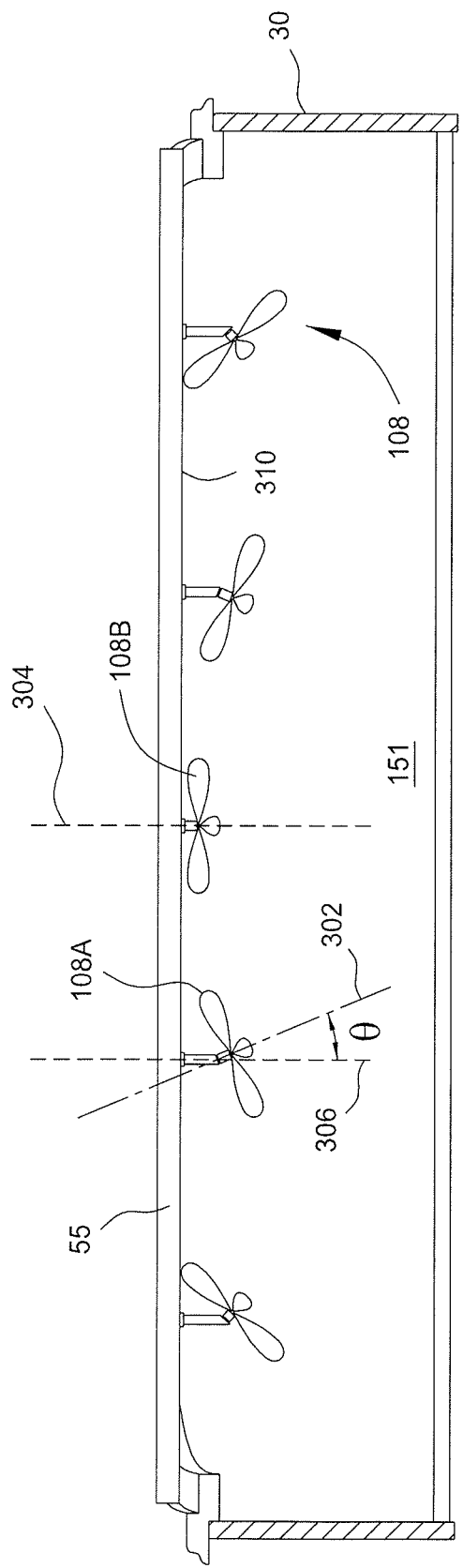
FIG. 3 is a schematic diagram of one embodiment of a plurality of air circulating elements disposed adjacent to the coil antenna assembly of FIG. 1.

FIG. 3 depicts a schematic view of one embodiment of the plurality of air circulating elements 108 disposed on a lower surface 310 of the support plate 55 on the ceiling of the coil positioning region 151. The air circulating elements 108 may have a central axis 304 configured to be perpendicular to the lower surface 310, e.g., the ceiling, of the support plate 55. In one example, one of the air circulating elements 108*a* may be disposed on the ceiling of the coil positioning region 151 having the central axis 304 perpendicular to the support plate 55. In contrast, in another embodiment, another air circulating elements 108*b* may have a center axis 302 having a tilted angle, θ, tilted away from a vertical axis 306 perpendicular to the support plate 55. It is noted that the tilted angle, θ, may be from zero degree to 90 degree related to the vertical axis 306. In the embodiment depicted in FIG. 3, the air circulating elements 108*b* may be tilted at a tilted angle, θ, between about 10 degrees and about 85 degrees.

In one embodiment, the air circulating elements 108 may be fabricated from a heat resistance material, such as a conductive material or a ceramic material. In one embodiment, the air circulating elements 108 may be made by aluminum or alloys thereof.

As the temperature control in the coil antenna enclosure 30 may be well controlled by implement of the cooling mechanism 191, voltage supplied to the coil antenna assembly 104 may be driven higher, so as to provide higher plasma energy to produce more productive/aggressive process results. By utilizing the cooling mechanism 191, it is believed about more 20 percent of the RF generation efficiency may be improved and realized. Furthermore, width of the coils in the coil antenna assembly 104 may also be widened to as to carry higher RF power energy during a plasma process. In one embodiment, the width of the coils in the coil antenna assembly 104 may be increased about 15 percent than conventional coils without the cooling mechanism 191.

Thus, a cooling mechanism utilized in a plasma reactor with enhanced temperature regulation is provided. As the cooling mechanism may efficiently cool and circulate thermal energy generated during a plasma process out of the plasma reactor, a more reliable and predictable processing environment may be realized.

While the foregoing is directed to embodiments of the present invention, other and further embodiments of the invention may be devised without departing from the basic scope thereof, and the scope thereof is determined by the claims that follow.

What is claimed is:

1. A method for regulating temperature of a coil antenna assembly disposed above a processing chamber, the method comprising:
   rotating a plurality of air circulators disposed adjacent to the coil antenna assembly in a coil antenna enclosure;
   directing ambient air into the coil antenna enclosure from one or more perforations formed in a sidewall of the coil antenna enclosure;
   guiding the ambient air to a center region of the coil antenna assembly through a central opening formed in a baffle plate disposed underneath the coil antenna assembly; and
   directing air out of the coil antenna enclosure.

2. The method of claim 1, wherein the air circulators are disposed above the coil antenna assembly.

3. The method of claim 1, wherein the air circulators include at least one of fans or stirrers.

4. The method of claim 1, wherein directing air out of the coil antenna enclosure further comprises pushing air out of the coil antenna enclosure through one or more perforations formed in a ceiling of the coil antenna enclosure.

5. The method of claim 1, wherein the coil antenna enclosure is provided above the processing chamber, and wherein the baffle plate is disposed above and substantially parallel to a lid of the processing chamber.

6. The method of claim 1, wherein guiding the air to the center region of the coil antenna assembly further comprises guiding the air underneath a bottom surface of the baffle plate and up through the central opening.

7. The method of claim 1, wherein the one or more perforations are formed in a bottom portion of the sidewall of the coil antenna enclosure.

8. The method of claim 7, wherein the baffle plate is horizontally disposed in the coil antenna enclosure at a position above the perforations.

9. The method of claim 1, wherein the coil antenna assembly includes an inner coil and an outer coil concentric with the inner coil.

10. The method of claim 9, wherein the central opening of the baffle plate is located inwards of the inner coil.

11. The method of claim 1, wherein the central opening of the baffle plate is substantially circular, and concentric with one or more coils of the coil antenna assembly.

12. The method of claim 1, wherein the air circulators have a central axis perpendicular to a ceiling of the coil antenna enclosure.

13. The method of claim 1, wherein the air circulators have a central axis that is tilted away by an acute angle from an axis perpendicular to a ceiling of the coil antenna enclosure.

14. The method of claim 1, wherein a length of a diameter of the central opening in the baffle plate is between ⅗ths and ⅘ths of a length of a diameter of the baffle plate.

15. A method for dissipating heat energy from a coil antenna enclosure, including heat energy released during a plasma process, the method comprising:
   drawing ambient air into the coil antenna enclosure through one or more first perforations in a sidewall of the coil antenna enclosure;
   guiding the ambient air from the one or more first perforations along a lower surface of a baffle plate provided within the coil antenna enclosure, and underneath a coil antenna assembly, and upwards through a central opening in the baffle plate; and
   forcing heated air adjacent to the coil antenna assembly upwards through one or more second perforations in a ceiling of the coil antenna enclosure.

16. The method of claim 15, wherein drawing ambient air into the coil antenna enclosure further comprises:
   turning on one or more fans or stirrers, and wherein turning on the one or more fans or stirrers includes causing one or more fans or stirrers to rotate.

17. The method of claim 16, further comprising determining that excess thermal energy has been released from the coil antenna enclosure, and, in response to the determination, turning off the one or more fans or stirrers.

18. The method of claim 17, further comprising regulating a temperature of the coil antenna enclosure by repeatedly turning on and off the one or more fans or stirrers.

19. The method of claim 15, wherein the central opening in the baffle plate opens to a center region of the coil antenna enclosure defined by an inner coil of the coil antenna assembly.

20. The method of claim 15, wherein the baffle plate comprises a material that has a high heat resistance, that is an electric insulator, or both.

* * * * *